(12) United States Patent
Haentzschel et al.

(10) Patent No.: US 7,796,707 B2
(45) Date of Patent: Sep. 14, 2010

(54) DEVICE FOR CONVERTING A COMPLEX-VALUED BANDPASS SIGNAL INTO A DIGITAL BASEBAND SIGNAL

(75) Inventors: Dirk Haentzschel, Duerroehrsdorf-Dittersbach (DE); Thomas Hanusch, Coswig (DE); Michael Schmidt, Dresden (DE)

(73) Assignee: Atmel Automotive GmbH, Heilbronn (DE)

( * ) Notice: Subject to any disclaimer, the term of this patent is extended or adjusted under 35 U.S.C. 154(b) by 983 days.

(21) Appl. No.: 11/528,397

(22) Filed: Sep. 28, 2006

(65) Prior Publication Data
US 2007/0071133 A1 Mar. 29, 2007

(30) Foreign Application Priority Data
Sep. 28, 2005 (DE) .................. 10 2005 046 245

(51) Int. Cl.
*H03D 3/00* (2006.01)
(52) U.S. Cl. ........................................ 375/322
(58) Field of Classification Search .......... 375/316,
375/340, 343, 346, 348, 350, 322; 455/130,
455/150.1, 188.1, 189.1, 196.1, 205, 208,
455/209, 269, 280, 293, 296, 313, 318; 708/100,
708/200, 300, 313, 301, 306, 314, 322, 323;
341/126, 155; 333/167, 165, 24 R
See application file for complete search history.

(56) References Cited
U.S. PATENT DOCUMENTS
4,953,184 A 8/1990 Simone
5,493,721 A 2/1996 Reis
5,568,206 A * 10/1996 Goeckler ................. 348/726
5,937,341 A * 8/1999 Suominen ................. 455/324

(Continued)

FOREIGN PATENT DOCUMENTS
DE 42 37 692 C1 3/1994

(Continued)

OTHER PUBLICATIONS
Notor et al., "CMOS RFIC Architecture for IEEE 802.15.4 Networks", IEEE 2003.*

(Continued)

*Primary Examiner*—David C Payne
*Assistant Examiner*—Vineeta S Panwalkar
(74) *Attorney, Agent, or Firm*—Muncy, Geissler, Olds & Lowe, PLLC

(57) ABSTRACT

A device is disclosed for converting a complex-valued bandpass signal into a digital baseband signal having: a) an analog filter unit to filter the complex-valued bandpass signal to produce only the real component from the filtered signal, and to provide a real-valued bandpass signal, b) one analog-to-digital converter that is connected to the analog filter unit and that is designed to convert the real-valued bandpass signal into a digital signal with sampled values with a width of one bit, c) a digital filter unit embodied as a lookup table, to provide a complex-valued filtered signal such that signal components outside of the useful band are suppressed, d) a sampling rate reduction unit to reduce the sampling rate of the complex-valued filtered signal and provide a reduced-rate signal, and e) a mixer unit to convert the reduced-rate signal into the digital baseband signal.

14 Claims, 2 Drawing Sheets

U.S. PATENT DOCUMENTS

| | | | |
|---|---|---|---|
| 7,020,221 B2 * | 3/2006 | Glas et al. | 375/329 |
| 7,120,415 B2 | 10/2006 | Minnis et al. | |
| 2001/0033628 A1 * | 10/2001 | Schubert et al. | 375/355 |
| 2002/0058491 A1 | 5/2002 | Minnis et al. | |
| 2003/0156052 A1 | 8/2003 | Hammes et al. | |

FOREIGN PATENT DOCUMENTS

| | | |
|---|---|---|
| DE | 100 44 456 A1 | 4/2002 |
| GB | 1174710 A | 12/1969 |
| WO | WO 02/43259 A2 | 5/2002 |

OTHER PUBLICATIONS

Pilsoon Choi et al., "An Experimental Coin-Sized Radio for Extremely Low-Power WPAN (IEEE 802.15.4) Application at 2.4 GHz," IEEE Journal of Solid-State Circuits, vol. 38, No. 12, Dec. 2003, pp. 2258-2268; XP-001221476, ISBN: 0018-9200.

Rudy Van De Plassche, "Integrated Analog-To-Digital and Digital-toAnalog Converters," Boston, Dordrecht, London: Kluwer Academic Publishers, 1994, p. 434; ISBN 0-7923-9436-4.

* cited by examiner

DEVICE FOR CONVERTING A COMPLEX-VALUED BANDPASS SIGNAL INTO A DIGITAL BASEBAND SIGNAL

This nonprovisional application claims priority under 35 U.S.C. §119(a) on German Patent Application No. DE 102005046245, which was filed in Germany on Sep. 28, 2005, and which is herein incorporated by reference.

BACKGROUND OF THE INVENTION

1. Field of the Invention

The present invention relates to a device for converting a complex-valued bandpass signal into a digital baseband signal. The invention further relates to a transmitting receiving device and an integrated circuit having such a device.

2. Description of the Background Art

The invention is in the field of telecommunications. In particular, it is in the field of digital telecommunications systems, in which a plurality of transmitting/receiving devices access a certain frequency band or a part thereof according to a multiple access method. In this context, it is necessary in the receiving unit of each transmitting/receiving device to convert a bandpass signal, for example a radio signal received through an antenna or an intermediate-frequency signal derived therefrom, into a digital baseband signal before the data values contained therein, which originate from another transmitting/receiving device, can be detected.

Although they are applicable in principle to any desired wireless or wired telecommunications systems, the present invention and the problem on which it is based are described below using a "ZigBee" communications system per IEEE 802.15.4.

Wireless Personal Area Networks (WPANs) may be used for wireless transmission of information over relatively short distances (approximately 10 m). In contrast to Wireless Local Area Networks (WLANs), WPANs require little, or even no, infrastructure for data transmission, so that small, simple, energy-efficient and low-cost devices can be implemented for a wide range of applications.

IEEE Standard 802.15.4-2003 (herein after referred to as 802.15.4) specifies low-rate WPANs which, with raw data rates of up to 250 kbit/s and fixed-position or mobile devices, are suitable for applications in industrial monitoring and control, in sensor networks, in automation, as well as in the field of computer peripherals and for interactive games. The ability to implement the devices very simply and economically is critical for such applications, as is an extremely low power requirement. Hence, this standard aims for battery lifetimes of several months to several years.

At the level of the physical layer, IEEE Standard 802.15.4 specifies a total of 16 (carrier frequency) channels at 5 MHz intervals in the ISM band (industrial, scientific, medical) around 2.4 GHz, which is usable almost worldwide. For raw data rates of 250 kbit/s a symbol rate of 62.5 ksymbol/s and a band spread (spreading) with a chip rate of fC=2 Mchip/s and offset QPSK modulation (quaternary phase shift keying) is provided in these channels.

On the receive side, the bandpass radio signal transmitted in the ISM band must first be converted (i.e., transformed) into a digital baseband signal. While other circuit units of the receiving unit need not be activated until after successful synchronization, the device for converting the bandpass signal into the baseband must already be active during what is known as the listening phase (RX listen mode) for the preamble sequence. For this reason, energy consumption of this device is extremely important to the energy consumption of the transmitting/receiving device as a whole.

Known devices for converting a bandpass signal into a digital baseband signal require two analog-to-digital converters to digitize the real and imaginary components of the complex-valued signal that has been shifted into the baseband or an intermediate frequency range. This has the disadvantages of a high implementation cost and increased energy consumption during operation. Moreover, arithmetic units such as filters, etc., for carrying out discrete-time arithmetic operations such as addition and/or multiplication, are often included as well, which is disadvantageous with regard to the implementation cost of the transmitting/receiving device in question and also with regard to the energy consumption during operation.

SUMMARY OF THE INVENTION

It is therefore an object of the present invention to provide a device for converting a complex-valued bandpass signal into a digital baseband signal that requires neither two analog-to-digital converters nor arithmetic units to carry out discrete-time arithmetic operations, thus making it possible to implement transmitting/receiving devices simply and economically, and to operate them in an energy-saving manner.

The inventive device has the following units: a) an analog filter unit that is designed to filter the complex-valued bandpass signal such that signal components outside of the useful band are suppressed, to produce only the real component from the filtered signal, and to provide a real-valued bandpass signal, b) one analog-to-digital converter that is connected to the analog filter unit and that is designed to convert the real-valued bandpass signal into a digital signal with sampled values with a width of one bit, c) a digital filter unit that is connected to the analog-to-digital converter, is embodied as a lookup table, and is designed to provide a complex-valued filtered signal in that the digital signal is filtered by complex-valued FIR filtering such that signal components outside of the useful band are suppressed, d) a sampling rate reduction unit that is connected to the digital filter unit and that is designed to reduce the sampling rate of the complex-valued filtered signal and provide a reduced-rate signal, and e) a mixer unit that is connected to the sampling rate reduction unit and that is designed to convert the reduced-rate signal into the digital baseband signal.

The inventive transmitting/receiving device and the inventive integrated circuit each have such a device.

A real-valued bandpass signal (intermediate frequency signal) is thus derived that is digitized with a resolution of only one bit per sampled value by only one analog-to-digital converter. Before the resulting digital (intermediate frequency) signal is converted to the baseband, a complex-valued FIR filtering is carried out by a digital filter unit embodied as a lookup table. Furthermore, the complex-valued filtered signal has its sampling rate reduced before it is finally converted into the digital baseband signal by a mixer unit. Such a device does not require two analog-to-digital converters, nor does it require arithmetic units, in order to carry out discrete-time multiplication or addition operations, and thus makes it possible to implement transmitting/receiving devices simply and economically, and to operate them in an energy-saving manner. As a result of the fact that according to the invention essentially only the input/output behavior is implemented, the signal propagation delays (latency times) otherwise associated with arithmetic units such as adder trees, etc., are also eliminated, which is especially advantageous at very high data rates.

In an embodiment, the analog filter unit can be designed to filter the complex-valued bandpass signal by a third order Butterworth filter. An analog filter unit of this nature suppresses adjacent channel signals and noise signals adequately well, and moreover is easy to implement and operates in an energy-saving way, thus making it possible to implement transmitting/receiving devices simply and economically, and to operate them in an energy-saving manner.

In another embodiment, the analog filter unit is designed to produce the real-valued bandpass signal by amplifying the values of the real component of the filtered signal and limiting them to a maximum value. In this way, a larger dynamic range can be covered at the input of the analog-to-digital converter. Since only the values of the real component of the filtered signal, which is to say only one real-valued signal, are amplified, low energy consumption and a reduced implementation cost are achieved in advantageous fashion.

The analog-to-digital converter can be designed to sample the real-valued bandpass signal with a sampling rate of 16 Msps. The use of this sampling rate at eight times the chip clock achieves the result, firstly, that the receiver sensitivity is sufficiently high at a resolution of one bit, and secondly, that the digital filter unit, in particular, is simple to implement.

In an embodiment, the digital filter unit has a binary shift register connected to the analog-to-digital converter, and a memory connected to the binary shift register and to the sampling rate reduction unit. In this context, the binary shift register is preferably designed to store five values of the digital signal, while the memory is preferably designed to store 64 complex values. This implementation of the digital filter unit is especially simple and energy-saving in operation.

In another embodiment, the mixer unit is designed to change the sign of the real and/or imaginary component of a value of the reduced-rate signal. In this way, the mixer unit is very simple to implement and energy-saving to operate.

In a further embodiment, the sampling rate reduction unit can be designed to reduce the sampling rate of the complex-valued filtered signal by a factor of two. The mixer unit here is designed to exchange the real component with the imaginary component of a value of the reduced-rate signal and/or to change the sign of the real component and/or imaginary component of the value. In this way, the filtered signal is converted to the baseband in a simple and energy-saving manner. The resultant digital baseband signal has sampled values with a rate corresponding to four times the chip clock, so that any time drift resulting from a frequency deviation between the transmitter oscillator and the receiver oscillator can advantageously be well compensated without an additional interpolating filter.

In another embodiment, the sampling rate reduction unit can be designed to reduce the sampling rate of the complex-valued filtered signal by a factor of four. In this case, the mixer unit is designed to switch the signs of the real and imaginary components of every second value of the reduced-rate signal. In this way, the filtered signal is converted to the baseband in a simple and energy-saving manner.

The complex-valued bandpass signal (and thus also the real-valued bandpass signal) can have a center frequency of essentially 2 MHz. Such a low value of the intermediate frequency has a beneficial effect on implementation complexity and energy consumption in the transmitting/receiving device.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Unless otherwise indicated, like and functionally like elements and signals are labeled with identical reference symbols in the figures.

Figure 1:
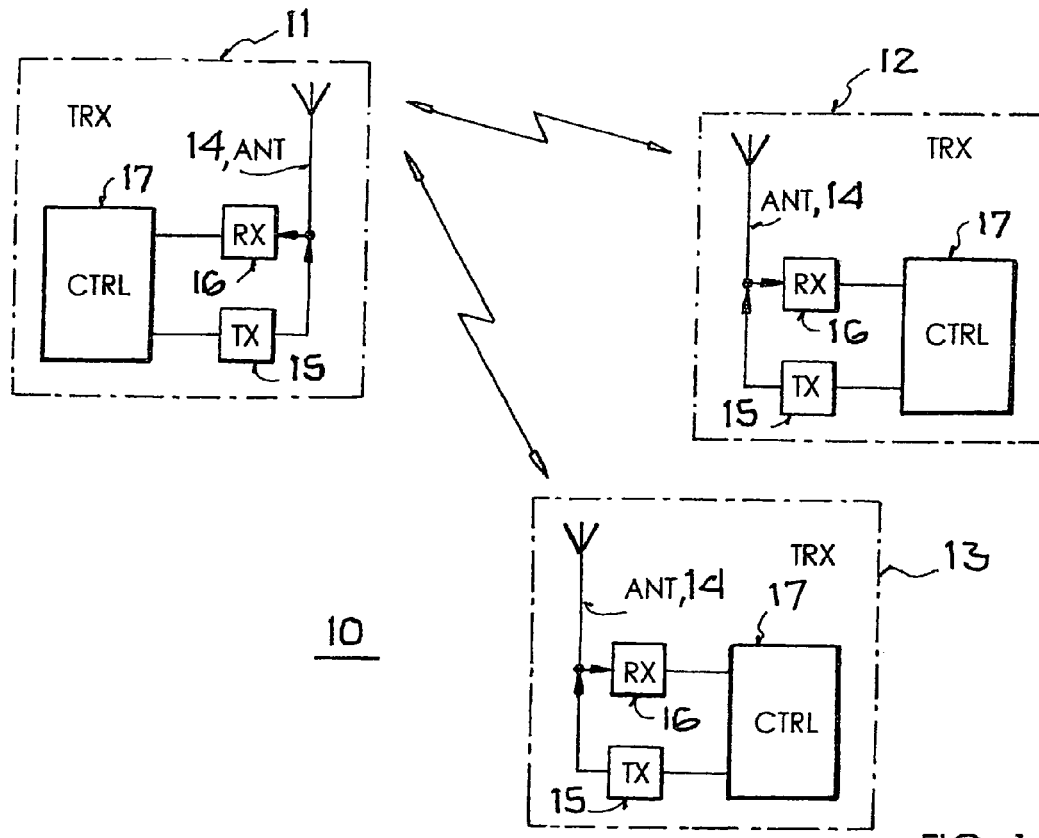
FIG. 1 illustrates an example of a Wireless Personal Area Network (WPAN) per IEEE 802.15.4 with a transmitting/receiving devices, according to an embodiment of the present invention.

FIG. 1 shows an example of a Wireless Personal Area Network (WPAN) 10 per IEEE Standard 802.15.4. It is comprised of three transmitting/receiving devices (transceiver, TRX) 11-13 in the form of stationary or mobile devices that wirelessly exchange information by means of radio signals. The transmitting/receiving device 11 is what is known as a full-function device, which assumes the function of the WPAN coordinator, while the transmitting/receiving devices 12, 13 are so-called limited function devices, which are associated with the full-function device 11 and can exchange data only with it. In addition to the star-shaped network topology shown in FIG. 1, in which bidirectional data transmission can occur only between one of the limited function devices 12, 13 at a time and the full-function device 11, but not between the limited function devices 12, 13, the standard also provides what are called peer-to-peer topologies, in which every full-function device can communicate with every other full-function device.

The transmitting/receiving devices 11-13 are each composed of an antenna 14, a transmitting unit (transmitter, TX) 15 associated with the antenna, a receiving unit (receiver, RX) 16 associated with the antenna, and a control unit (control unit, CTRL) 17 associated with the transmitting and receiving units for controlling the transmitting and receiving units 15, 16. In addition, the transmitting/receiving devices 11-13 each include a power supply unit (not shown in FIG. 1) in the form of a battery or the like to supply energy to the units 15-17, as well as possible additional components such as sensors, actuators, etc.

The explanation below assumes that the data transmission takes place in the ISM (industrial, scientific, medical) band at 2.4 GHz.

The transmitting unit 15 of each transmitting/receiving device converts the data stream to be transmitted in each case per IEEE 802.15.4 into a radio signal for radiation through its antenna 14 in that the data stream to be transmitted (raw data rate: 250 kbit/s) in each case is first converted into four-bit-wide symbols (symbol rate: 62.5 ksymbol/s), and these are converted into consecutive PN sequences (pseudo noise) of 32 chips each (chip rate: fC=2 Mchip/s). Thus, the spreading gain is 8. The consecutive PN sequences are then offset QPSK modulated (quaternary phase shift keying), with half-sine pulse shaping, spectrally shifted into one of the 16 channels of the ISM band, and finally amplified for transmission.

The receiving unit 16 of each transmitting/receiving device converts a radio signal—received by its antenna 14 and generated per IEEE 802.15.4 by the transmitting unit of a second transmitting/receiving device—into the transmitted data in as error-free a manner as possible in that the received radio signal is filtered, transformed into the baseband, demodulated, and the data detected (decided), among other things. In addition to the information channel component, i.e. the transmit signal transmitted in the desired channel by the second transmitting/receiving device, the received signal can contain adjacent channel components, i.e. transmit signals transmitted in spectrally adjacent channels by third transmitting/receiving devices.

The transmitting unit 15 and the receiving unit 16 of a transmitting/receiving device here are part of an integrated circuit (not shown in FIG. 1), for example of an ASIC (application specific integrated circuit) or of an ASSP (application specific standard product), while the control unit 17 is implemented as a microcontroller (likewise not shown). Advantageously, the transmitting/receiving device has only one integrated circuit (e.g. implemented as an ASIC or ASSP), which performs the functions of the transmitting unit 15, the receiving unit 16, and the control unit 17.

Figure 2:
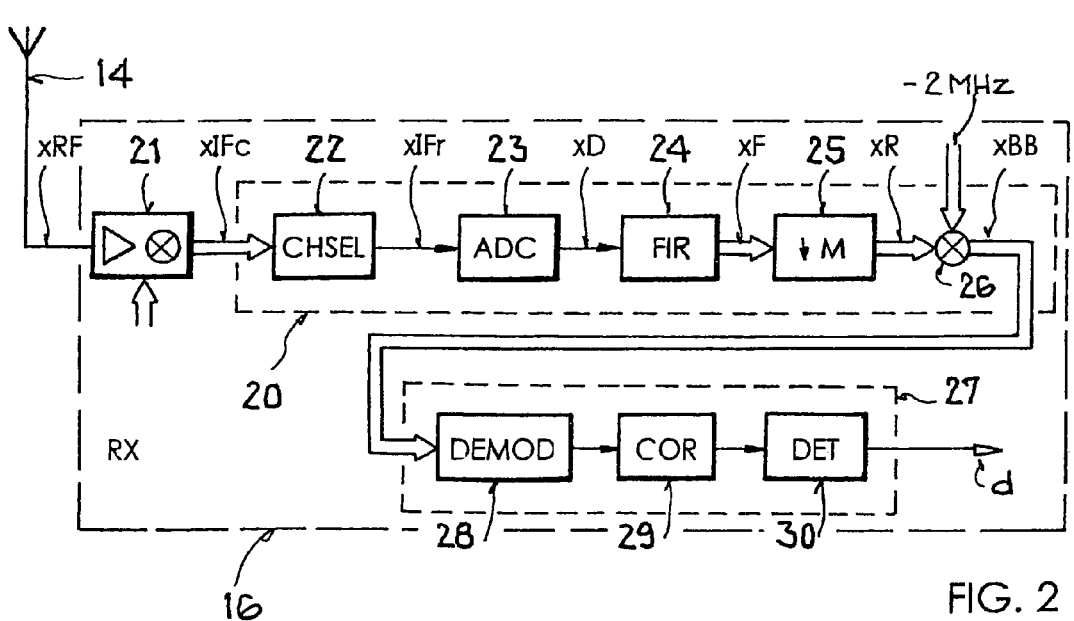
FIG. 2 illustrates a receiving unit of a transmitting/receiving device per IEEE 802.15.4 with the device according to an embodiment of the present invention.
Figure 3:
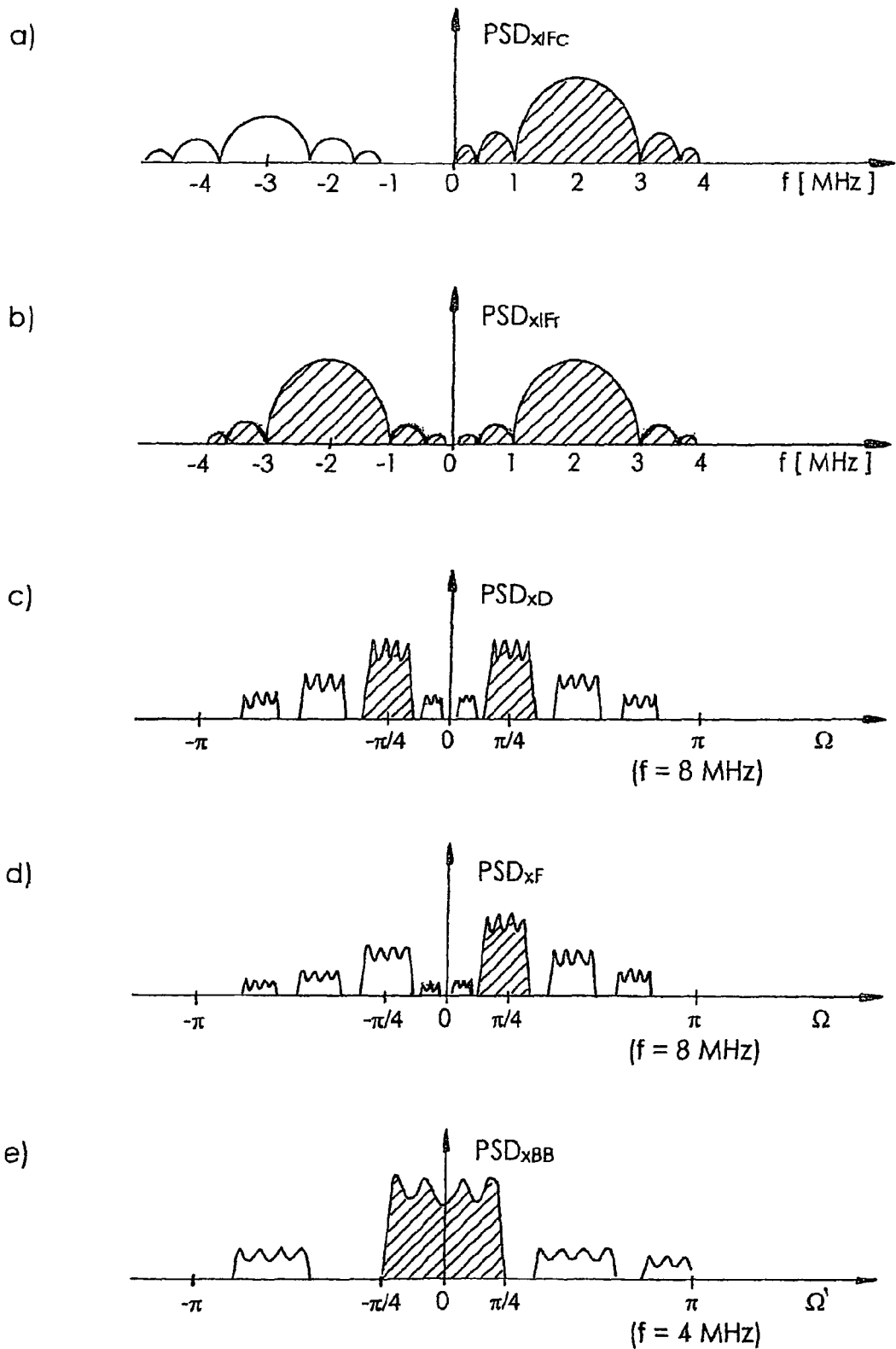
FIGS. 3a-e illustrate power spectral densities of various signals in the first embodiment from FIG. 2.

FIG. 2 shows a block diagram of a receiving unit (RX) 16 with an inventive device 20 for converting a complex-valued bandpass signal into a digital baseband signal. FIG. 3 schematically shows the power spectral densities of various signals from FIG. 2.

As shown in FIG. 2, the receiving unit 16 contains an amplifier/mixer unit 21 connected to the antenna 14, the inventive device 20 following the amplifier/mixer unit 21, and a data detection unit 27 connected subsequent to the device 20. Using the complex-valued bandpass signal xIFc provided by the amplifier/mixer unit 21, the device 20 generates a digital baseband signal xBB that likewise is complex-valued, and which subsequently is demodulated and detected (decided) in the data detection unit 27, in order to recreate the data values originally transmitted. Complex-valued signals or line connections for transmitting complex-valued signals are indicated in the figures by arrows with double lines.

The device 20 has the following functional blocks connected in series: an analog filter unit (CHSEL) 22, an analog-to-digital converter (ADC) 23, a digital filter unit (FIR) 24, a sampling rate reduction unit 25, and a mixer unit 26. The analog filter unit 22 here is connected on the input side to the amplifier/mixer unit 21, while the mixer unit 26 has an output connected to the data detection unit 27.

The data detection unit 27, which is designed to detect the transmitted data values, has a demodulation unit 28 connected on the input side to the mixer unit 26 of the device 20, a following correlation unit 29, and a detection unit 30 following the correlation unit 29.

The real-valued radio signal xRF received from the antenna 14, which—as described above with reference to FIG. 1—may possibly have one or more spectrally separated adjacent channels, is first amplified in the amplifier/mixer unit 21 by means of a low-noise amplifier (LNA) and is decomposed into an in-phase component (I) and a quadrature-phase component (Q) by a polyphase filter. The complex-valued receive signal (with real component I and imaginary component Q) thus produced is then converted to an intermediate frequency range in the vicinity of 2 MHz with the aid of two mixers, thus forming the intermediate frequency signal xIFc (IF, intermediate frequency). The intermediate frequency signal xIFc is a complex-valued bandpass signal. The power spectral density (PSD) of the intermediate frequency signal xIFc is shown schematically in FIG. 3a. It is evident from FIG. 3a that, as a result of the conversion into the intermediate frequency range, the center frequency of the information channel component (shown with cross-hatching) is at the intermediate frequency fIF=2 MHz, and the center frequency of the spectrally closest left adjacent channel component (shown without cross-hatching) is at fIF−5 MHz=−3 MHz on account of the channel spacing of 5 MHz. On account of the low value of the intermediate frequency fIF of 2 MHz as compared to the carrier frequency (approximately 2.4 GHz), the receiving unit 16 shown in FIG. 2 is called a "low IF" receiving unit.

The analog filter unit (CHSEL) 22 is designed to derive a real-valued bandpass signal xIFr in that the complex-valued bandpass signal xIFc is filtered such that signal components outside of the useful band, e.g. the information channel frequency band, are suppressed, and the real component is produced from the filtered signal. The purpose of the filter unit 22 is, firstly, selection of the desired channel (information channel) or suppression of adjacent channels, and, secondly, noise band limiting. To this end, the bandwidth of the complex-valued bandpass signal xIFc is limited to approximately 2 MHz in the filter unit 22 by means of a complex third order Butterworth filter. Such a filter unit 22 is simple to implement and operates in an energy-saving way. Advantageously the values of the real component of the filtered signal are subsequently amplified in the filter unit 22 by means of something known as a limiter amplifier, and limited to a maximum value such that the absolute real component values do not exceed the maximum value.

Since only the real component (xIFr) of the filtered signal is produced and further processed, the receiving unit 16 shown in FIG. 2 is called a "real-valued low IF" receiving unit. As a result of the real component production, the structure of the following functional blocks, and hence of the overall receiving unit, is simplified significantly. Thus, in advantageous fashion only one analog-to-digital converter, in particular, is required for the subsequent signal processing.

In FIG. 3b, the power spectral density of the real-valued bandpass signal xIFr is shown schematically. As a result of the real component production, a conjugate even spectrum is produced, and hence a symmetrical power spectral density with respect to the frequency f=0.

The real-valued bandpass signal xIFr is sampled by the analog-to-digital converter 23, preferably with a sampling rate of 16 Msps (megasamples per second) or a sampling frequency of 16 MHz (e.g., with an integer multiple of the intermediate frequency fIF), and quantized with a bit width N of only one bit. Because of the digitization in the intermediate frequency range, the receiving unit 16 shown in FIG. 2 is called a "digital low IF" receiving unit. Simulations carried out by the applicant have demonstrated that the receiver sensitivity resulting from the quantization with N=1 bit is only negligibly worse than the theoretical case of quantization with infinite precision (resolution). The power spectral density of the resultant digital IF signal is represented schematically in FIG. 3c as a function of the normalized angular frequency $\Omega=2\pi*(f/fS)$, where the value $\Omega=\pi$ corresponds to an unnormalized frequency of f=fS/2=8 MHz. Since the digital signal xD is also real-valued, a power spectral density that is symmetric about $\Omega=0$("even") results here as well. In addition to the cross-hatched useful band components shown about $\Omega=\pm\pi/4$ or $f=\pm fS/8=\pm fIF=\pm 2$ MHz, interference components resulting from quantization with only one bit (N=1) can be seen in FIG. 3 (not cross-hatched).

The digital filter unit 24 filters the digital signal xD by means of a complex-valued FIR filter (finite impulse response) such that signal components outside of the useful band, which have arisen, for example, through the quantization during the analog-to-digital conversion, are suppressed, and provides a complex-valued, filtered signal xF. The digital filter unit 24 is implemented as a lookup table, and has a binary shift register connected to the ADC 23, and a memory connected to the shift register, to the ADC 23, and to the rate reduction unit 25, in which memory are stored all possible values of the filtered signal xF. Simulations by the applicant have demonstrated that the FIR filtering can advantageously be performed with six filter coefficients. In this case, six sequential bit values of the digital signal xD form an address, with the aid of which precisely one of the total of $2^6=64$ stored complex values is read out of the memory and provided as the value of the filtered signal xF. The address here is composed in each case of the current bit value of xD and the 5 preceding bit values that are buffered in the binary shift register with length 5. With a filter of this nature, which requires no arithmetic operations at all, the bandwidth of the digital signal xD is limited to approximately 2 MHz, and an attenuation of approximately 20 dB is achieved. The power spectral density of the filtered signal xF is shown schematically as a function of the normalized angular frequency $\Omega$ in FIG. 3d. Since the filtered signal xF is complex-valued, a power spectral density results that is not symmetric about $\Omega=0$. In addition to the cross-hatched useful band components shown about $\Omega=+\pi/4$ or $f=fS/8=fIF=2$ MHz, it is evident from the areas shown without cross-hatching in FIG. 3d that the quantization interference components have been attenuated by the filtering.

The sampling rate reduction unit 25 is designed to reduce the sampling rate of the complex-valued filtered signal xF by a factor $M\geq 2$, and to provide a reduced-rate signal xR. Finally, the likewise complex-valued reduced-rate signal xR is spectrally shifted into the baseband (by 2 MHz to the left) by means of the mixer unit 26, thus generating the complex-valued digital baseband signal xBB.

According to a first, preferred example embodiment, the sampling rate of the filtered signal xF is reduced by a factor M=2 to 16 Msps/2=8 Msps in the sampling rate reduction unit 25. As a result, the mixer unit 26 can be implemented very simply. In the case of the first example embodiment (sampling rate=4*fC=8 Msps), the multiplication by a complex exponential series that is required per se for baseband mixing is advantageously simplified into a multiplication by the time-variant factor:

$$\exp(-j*k*\pi/2)=(-j)^k, \quad (1)$$

where exp(•) designates the complex exponential function and k designates the time index of the value of the reduced-rate signal xR. Depending on the value of the index k, the associated complex value of xR must therefore be multiplied by one of the values $\{\pm 1, \pm j\}$ so that the mixer unit 26 need only be able to change the sign of the real and/or imaginary component of the value of xR and/or exchange the real component with the imaginary component. None of these operations requires arithmetic operations such as addition or multiplication.

The power spectral density of the digital baseband signal xBB is represented schematically in FIG. 3e as a function of the normalized angular frequency $\Omega'=M*\Omega=4\pi*(f/fS)$, where the value $\Omega'=\pi$ corresponds to an unnormalized frequency of f=fS/M/2=fS/4=4 MHz. Since the baseband signal xBB is complex-valued, a power spectral density results that is not symmetric about $\Omega'=0$. The useful band component about $\Omega'=0$ (baseband), which again is shown cross-hatched, now extends from $\Omega'=-\pi/4$ to $\Omega'=+\pi/4$ on account of the rate reduction by the factor M=2. This corresponds to a frequency range of f=-fS/16=-1 MHz to +1 MHz.

In a second example embodiment, the sampling rate of the filtered signal xF is reduced in the sampling rate reduction unit 25 by a factor M=4 to 16 Msps/4=4 Msps, i.e., to twice the chip rate fC. In this case, the complex multiplication simplifies to a multiplication by:

$$\exp(-j*k*\pi)=(-1)^k, \quad (2)$$

which is to say to a sign change of the real and imaginary components of every second value of xR, namely those with odd index k. Hence, no arithmetic operations are necessary in this case as well.

At 8 Msps (first example embodiment) or 4 Msps (second example embodiment), the digital baseband xBB has a rate that corresponds to four or two times the chip rate fC (fC=2 Mchip/s). This signal xBB is fed to the demodulation unit 28 and to a synchronization unit that is not shown in FIG. 2. By means of a correlation of xBB to a preamble sequence of the data frame, the synchronization unit determines the best of the total of four or two sampling phases, so that the digital baseband signal xBB can be subsampled by the factor four or two with optimal phase in the demodulation unit 28.

The resultant chip clock signal is then demodulated in the demodulation unit 28 by means of an MSK demodulator, and is despread by the correlation unit 29, i.e., is correlated with PN sequences. The transmitted data are finally detected (decided) in the detection unit 30 in that the correlation results are analyzed and the maximum correlation result is associated with the corresponding data (symbol) value or the corresponding data bits.

Even though the present invention has been described above on the basis of example embodiments, it is not restricted thereto, but can instead be modified in multiple ways. Thus, for example, the invention is neither restricted to WPANs per se, nor to WPANs per IEEE 802.15.4, nor to the band spreading methods, modulation methods, multiple access methods, frequency bands, bit rates, symbol rates, chip rates, and number of levels, etc., specified therein, nor to the stated values of the intermediate frequency, sampling frequency, filter bandwidths, filter types, and filter orders, etc. Rather, the invention can be used to advantage in an extremely wide variety of wireless or wired digital communications systems.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A device for converting a complex-valued bandpass signal into a digital baseband signal, the device comprising:
    an analog filter unit for filtering the complex-valued bandpass signal so that signal components outside of a useful band are suppressed to produce only a real component from the filtered signal, and to provide a real-valued bandpass signal;

one analog-to-digital converter connected to the analog fitter unit and that converts the real-valued bandpass signal into a digital signal with sampled values with a width of one bit;

a digital filter unit connected to the analog-to-digital converter, the digital filter being a lookup table and providing a complex-valued filtered signal in that the digital signal is filtered by complex-valued FIR filtering so that signal components outside of the useful band are suppressed;

a sampling rate reduction unit connected to the digital filter unit for reducing a sampling rate of the complex-valued filtered signal and for providing a reduced-rate signal; and a mixer unit connected to the sampling rate reduction unit for converting the reduced-rate signal into the digital baseband signal.

2. The device according to claim 1, wherein the analog filter unit filters the complex-valued bandpass signal by a third order Butterworth filter.

3. The device according to claim 1, wherein the analog filter unit produces the real-valued bandpass signal by limiting the values of the real component of the filtered signal to a maximum value.

4. The device according to claim 1, wherein the analog-to-digital converter samples the real-valued bandpass signal with a sampling rate of 16 Msps.

5. The device according to claim 1, wherein the digital filter unit has a binary shift register connected to the analog-to-digital converter and a memory connected to the binary shift register and to the sampling rate reduction unit.

6. The device according to claim 5, wherein the binary shift register stores five values of the digital signal, and wherein the memory stores 64 complex values.

7. The device according to claim 1, wherein the mixer unit changes a sign of the real and/or imaginary component of a value of the reduced-rate signal.

8. The device according to claim 1, wherein the sampling rate reduction unit reduces the sampling rate of the complex-valued filtered signal by a factor (M) of two, and wherein the mixer unit exchanges the real component with the imaginary component of a value of the reduced-rate signal and/or to change the sign of the real component and/or imaginary component of the value.

9. The device according to claim 1, wherein the sampling rate reduction unit reduces the sampling rate of the complex-valued filtered signal by a factor (M) of four, and wherein the mixer unit switches the signs of the real and imaginary components of every second value of the reduced-rate signal.

10. The device according to claim 1, wherein the complex-valued bandpass signal has a center frequency of about 2 MHz.

11. A transmitting/receiving device for a data transmission system, the device comprising:

an antenna;

a transmitting unit connected to the antenna for transmitting data;

a receiving unit connected to the antenna and having a converting device; and a control unit connected to the transmitting unit and the receiving unit for controlling the transmitting unit and receiving unit, wherein the converting device comprises:

an analog filter unit for filtering the complex-valued bandpass signal so that signal components outside of a useful band are suppressed to produce only a real component from the filtered signal, and to provide a real-valued bandpass signal;

one analog-to-digital converter connected to the analog filter unit and that converts the real-valued bandpass signal into a digital signal with sampled values with a width of one bit;

a digital fitter unit connected to the analog-to-digital converter, the digital filter being a lookup table and providing a complex-valued filtered signal in that the digital signal is filtered by complex-valued FIR filtering so that signal components outside of the useful band are suppressed;

a sampling rate reduction unit connected to the digital filter unit for reducing a sampling rate of the complex-valued filtered signal and for providing a reduced-rate signal; and a mixer unit connected to the sampling rate reduction unit for converting the reduced-rate signal into the digital baseband signal.

12. The transmitting/receiving device according to claim 11, wherein the rata is transmitted according to IEEE Standard 802.15.4-2003.

13. The device according to claim 1, wherein the device is an integrated circuit.

14. A device for converting a complex-valued bandpass signal having a plurality of spectrally separated channels into a digital baseband signal, the device comprising:

an analog filter unit configured to filter the complex-valued bandpass signal thereby selecting one channel of the plurality of spectrally separated channels so that signal components outside of a band defined by the selected channel are suppressed, the analog filter unit producing only a real component from the felt red signal and providing a real-valued bandpass signal;

one analog-to-digital converter connectable to the analog filter unit and configured to convert the real-valued bandpass signal into a digital signal with sampled values with a width of one bit;

a digital filter unit connectable to the analog-to-digital converter, the digital filter being a lookup table and providing a complex-valued filtered signal in that the digital signal is filtered by complex-valued FIR filtering so that signal components outside of the useful band are suppressed;

a sampling rate reduction unit connectable to the digital filter unit and configured to reduce a sampling rate of the complex-valued filtered signal and configured to provide a reduced-rate signal; and a mixer unit connectable to the sampling rate reduction unit and configured to convert the reduced-rate signal into the digital baseband signal.

* * * * *